United States Patent
Noh et al.

(10) Patent No.: US 12,067,287 B2
(45) Date of Patent: Aug. 20, 2024

(54) MEMORY CONTROLLER CALCULATING OPTIMAL READ LEVEL, MEMORY SYSTEM INCLUDING THE SAME, AND OPERATING METHOD OF MEMORY CONTROLLER

(71) Applicant: SAMSUNG ELECTRONICS CO., LTD., Suwon-si (KR)

(72) Inventors: Kwanwoo Noh, Hwaseong-si (KR); Hyeonjong Song, Suwon-si (KR); Wijik Lee, Suwon-si (KR); Hongrak Son, Anyang-si (KR); Dongmin Shin, Seoul (KR); Seonghyeog Choi, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 221 days.

(21) Appl. No.: 17/685,024

(22) Filed: Mar. 2, 2022

(65) Prior Publication Data

US 2023/0057932 A1    Feb. 23, 2023

(30) Foreign Application Priority Data

Aug. 17, 2021    (KR) .................. 10-2021-0108179

(51) Int. Cl.
*G06F 3/06* (2006.01)
*G11C 16/04* (2006.01)

(52) U.S. Cl.
CPC .......... *G06F 3/0658* (2013.01); *G06F 3/0614* (2013.01); *G06F 3/0679* (2013.01); *G11C 16/0483* (2013.01)

(58) Field of Classification Search
None
See application file for complete search history.

(56) References Cited

U.S. PATENT DOCUMENTS 7,936,601 B2    5/2011    Kang et al.
8,072,805 B2    12/2011    Chou et al.
(Continued)

FOREIGN PATENT DOCUMENTS

KR        10-0888842 B1    3/2009
KR    10-2017-0084733 A    7/2017
(Continued)

OTHER PUBLICATIONS

Communication dated May 21, 2022, issued by the Korean Intellectual Property Office in Korean Patent Application No. 10-2021-0108179.

(Continued)

*Primary Examiner* — Guerrier Merant
(74) *Attorney, Agent, or Firm* — Sughrue Mion, PLLC

(57) ABSTRACT

Provided are a memory controller calculating an optimal read level, a memory system including the memory controller, and an operating method of the memory controller. The memory controller includes: a processor configured to control a memory operation on the memory device; and a read level calculation module configured to: receive N counting values corresponding to N read levels generated based on a counting operation on data read by using a plurality of read levels, model at least two cell count functions having selected read levels that are selected from the N read levels as inputs, and the N counting values corresponding to the selected read levels as outputs, and calculate an optimal read level based on an optimal cell count function selected from the at least two cell count functions, wherein N is an integer equal to or greater than four, wherein the N counting values include counting values corresponding to at least four different read levels.

20 Claims, 13 Drawing Sheets

(56) References Cited

U.S. PATENT DOCUMENTS

| | | | |
|---|---|---|---|
| 8,365,030 B1* | 1/2013 | Choi | G06F 11/1048 |
| | | | 714/799 |
| 9,111,626 B2 | 8/2015 | Kim et al. | |
| 9,892,796 B2 | 2/2018 | Jin et al. | |
| 10,424,388 B2 | 9/2019 | Oh et al. | |
| 10,713,104 B2 | 7/2020 | Zhang et al. | |
| 10,957,400 B1 | 3/2021 | Horisaki et al. | |
| 11,004,519 B2 | 5/2021 | Lee et al. | |
| 11,114,174 B2 | 9/2021 | Oh et al. | |
| 11,189,358 B2 | 11/2021 | Choi et al. | |
| 2016/0148703 A1* | 5/2016 | Kim | G11C 16/0483 |
| | | | 365/185.11 |
| 2020/0151539 A1* | 5/2020 | Oh | G06N 5/04 |
| 2020/0210096 A1 | 7/2020 | Kim et al. | |
| 2021/0050067 A1* | 2/2021 | Oh | G11C 16/3495 |

FOREIGN PATENT DOCUMENTS

| | | |
|---|---|---|
| KR | 10-2018-0042889 A | 4/2018 |
| KR | 10-2038408 B1 | 10/2019 |
| KR | 10-2020-0057827 A | 5/2020 |
| KR | 10-2021-0020689 A | 2/2021 |
| KR | 10-2021-0024912 A | 3/2021 |
| KR | 10-2021-0082875 A | 7/2021 |

OTHER PUBLICATIONS

Communication dated Aug. 31, 2022, issued by the Korean Intellectual Property Office in Korean Patent Application No. 10-2021-0108179.

* cited by examiner

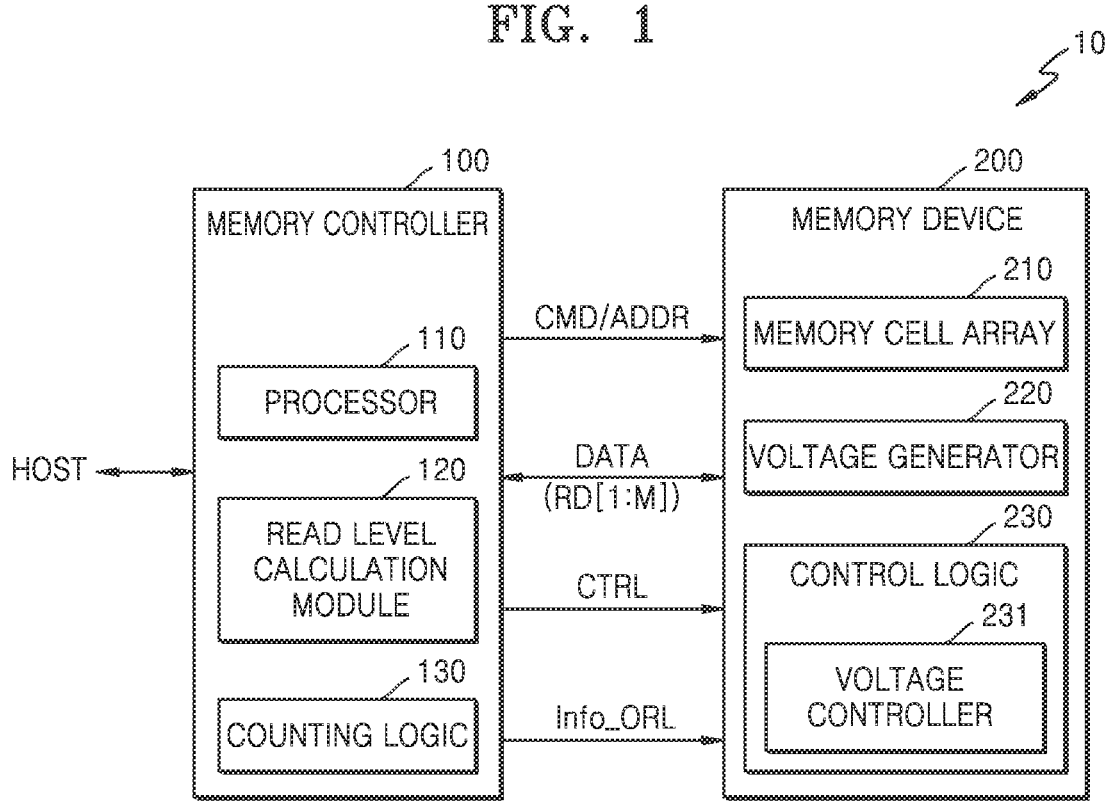
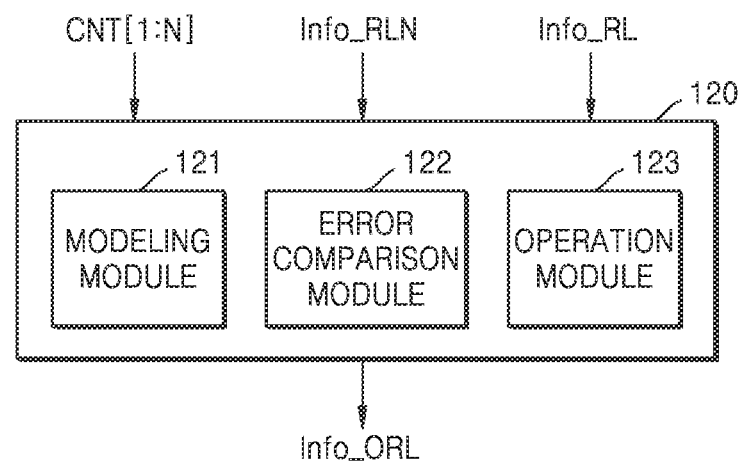

FIG. 12
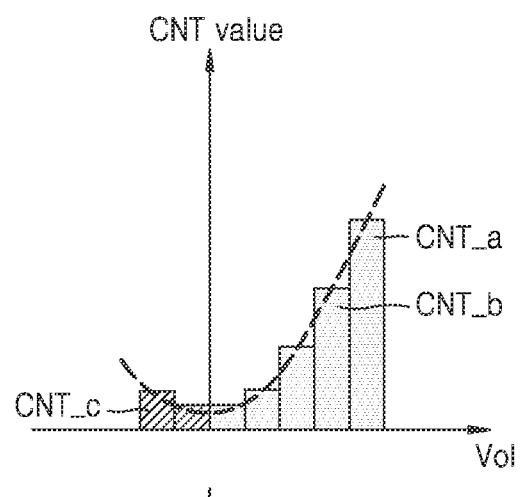
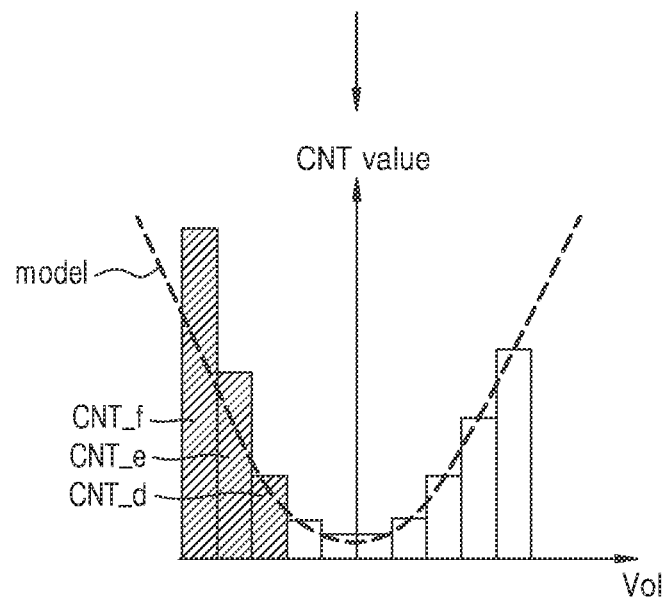

MEMORY CONTROLLER CALCULATING OPTIMAL READ LEVEL, MEMORY SYSTEM INCLUDING THE SAME, AND OPERATING METHOD OF MEMORY CONTROLLER

CROSS-REFERENCE TO RELATED APPLICATION

This application is based on and claims priority under 35 U.S.C. § 119 to Korean Patent Application No. 10-2021-0108179, filed on Aug. 17, 2021 in the Korean Intellectual Property Office, the disclosure of which is incorporated by reference herein in its entirety.

BACKGROUND

The present disclosure relates to a memory controller, and more particularly, to a memory controller calculating an optimal read level, a memory system including the same, and an operating method of the memory controller.

Flash memories, as non-volatile memories, may retain data stored therein even when power is turned off. Storage devices including the flash memories such as solid state drives (SSDs) and memory cards are widely used, and the storage devices are useful for storing or moving a large amount of data.

When the data storage capacity of flash memories is increased and the number of bits stored in each memory cell is increased, margins between a plurality of threshold voltage distributions may be reduced. Accordingly, to reduce an error in a data read process, an optimal read level calculation capable of identifying a plurality of threshold voltage distributions is required. However, due to noise generated in a read process together with reduction of the margins between the plurality of threshold voltage distributions as described above, there may be a limit in calculating the optimal read level.

SUMMARY

Example embodiments provide a memory controller capable of calculating an optimal read level, a memory system including the same, and an operating method of the memory controller.

According to an aspect of an example embodiment, there is provided a memory controller configured to control a memory device, the memory controller including: a processor configured to control a memory operation on the memory device; and a read level calculation module configured to: receive N counting values corresponding to N read levels generated based on a counting operation on data read by using a plurality of read levels, model at least two cell count functions having selected read levels that are selected from the N read levels as inputs, and the N counting values corresponding to the selected read levels as outputs, and calculate an optimal read level based on an optimal cell count function selected from the at least two cell count functions, wherein N is an integer equal to or greater than four, wherein the N counting values include counting values corresponding to at least four different read levels.

According to an aspect of an example embodiment, there is provided an operating method of a memory controller, the operating method including: calculating a plurality of counting values corresponding to a plurality of read levels based on data read by using a plurality of read operations; selecting, as an optimal cell count function, any one cell count function of a plurality of cell count functions, wherein the plurality of cell count functions are modeled by using some read levels selected among the plurality of read levels as inputs and corresponding counting values of the plurality of counting values as outputs; and outputting information about an optimal read level calculated based on the optimal cell count function, wherein function values having at least some of the plurality of read levels are calculated for each of the plurality of cell count functions, and the optimal cell count function is selected by comparing the function values with the plurality of counting values.

According to an aspect of an example embodiment, there is provided a memory system equipped with a memory device, wherein the memory device includes: a memory cell array including a plurality of memory cells; a voltage generator configured to generate a plurality of read voltages having a plurality of read levels used in a read operation on the memory cell array; and a control logic configured to: control a re-read operation on the memory cell array by using the plurality of read levels when an error occurs in data read from the memory cell array, and generate N counting values corresponding to N read levels based on a counting operation on data read in the re-read operation, N being an integer equal to or greater than four, wherein the N counting values include first information for modeling at least two cell count functions each having certain read levels of the N read levels as inputs, and a number of the certain read levels is less than N.

BRIEF DESCRIPTION OF THE DRAWINGS

The above and other aspects will be more clearly understood from the following description of example embodiments taken in conjunction with the accompanying drawings in which:

FIG. 1 is a block diagram of a memory system according to an example embodiment;

FIG. 2 is a block diagram of an implemented example of a read level calculation module included in the memory controller in FIG. 1;

FIG. 12 illustrates diagrams of examples of determining whether modeling is suitable and obtaining additional counting values in the embodiment of FIG. 11;

DETAILED DESCRIPTION

Figure 3A:
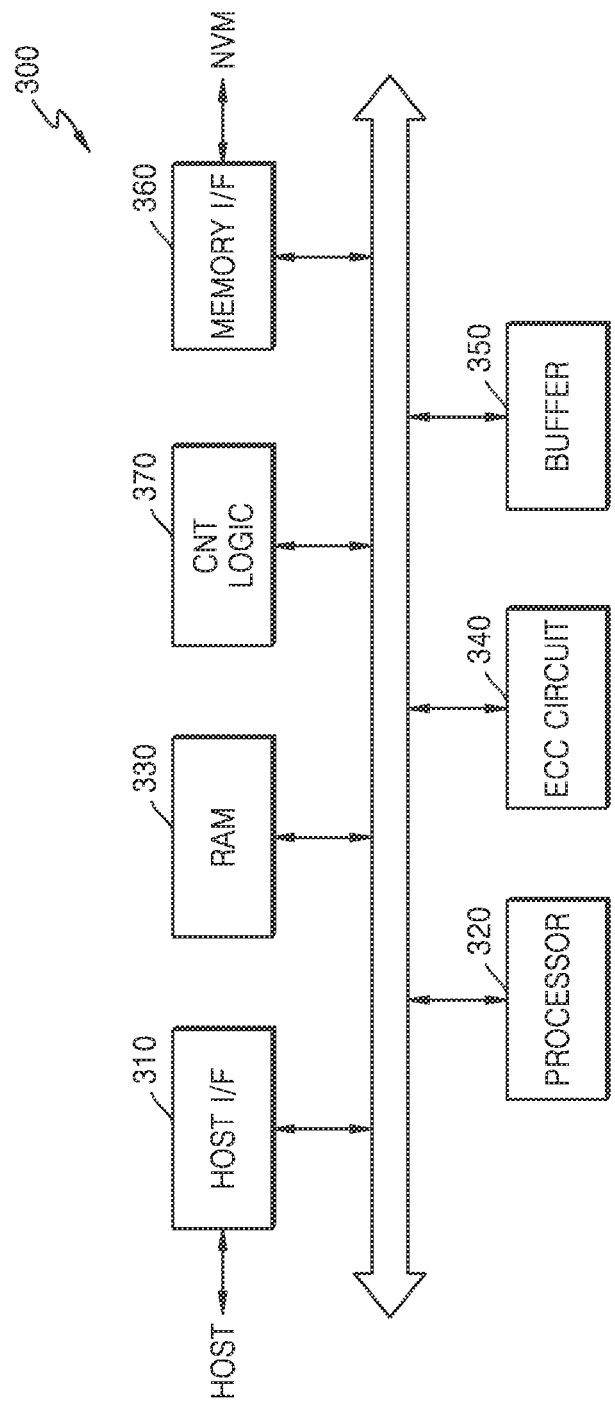
FIGS. 3A and 3B are block diagrams of implementation examples of a memory controller, according to an example embodiment.

Hereinafter, example embodiments are described in detail with reference to the accompanying drawings.

FIG. 1 is a block diagram of a memory system 10 according to an example embodiment.

Referring to FIG. 1, the memory system 10 may include a memory controller 100 and a memory device 200, the memory device 200 may include a memory cell array 210, a voltage generator 220, and a control logic 230, and the control logic 230 may include a voltage controller 231. In the example of FIG. 1, the voltage controller 231 is illustrated as being arranged in the control logic 230, but the voltage controller 231 according to an embodiment may be implemented as a discrete component outside the control logic 230.

For example, the memory system 10 may communicate with a host via various interfaces, and as an example, the memory system 10 may communicate with the host via various interfaces such as a universal serial bus (USB) interface, a multi-media card (MMC) interface, an embedded MMC (eMMC) interface, a peripheral component interconnect (PCI) interface, a PCI-express (PCI-E) interface, an advanced technology attachment (ATA) interface, a serial-ATA interface, a parallel-ATA interface, a small computer system interface (SCSI), an enhanced small disk interface (ESDI), an integrated drive electronics (IDE) interface, Firewire, a universal flash storage (UFS) interface, and a non-volatile memory (NVM) express (NVMe) interface.

According to an embodiment, the memory device 200 may include a non-volatile memory device. In some embodiments, the memory system 10 may be implemented as being embedded in an electronic device or as a removable memory, and the memory system 10 may be implemented in various forms of, for example, an embedded universal flash storage (UFS) memory device, an eMMC, a solid state drive (SSD), a UFS memory card, a compact flash (CF) card, a secured digital (SD) card, a micro-SD card, a mini-SD card, an extreme digital (xD) card, or a memory stick. In addition, the memory system 10 may also be referred to as a storage device for storing data in a non-volatile manner.

The memory controller 100 may control the memory device 200 to read data stored in the memory device 200 or to write data to the memory device 200 in response to a write/read request from a host HOST. As an example, the memory controller 100 may include a processor 110, and the processor 110 may control an overall operation inside the memory controller 100, and in addition, may control a memory operation of the memory device 200. The memory controller 100 may control the write, read and erase operations of the memory device 200 by providing an address ADDR, a command CMD, and a control signal CTRL thereto. In addition, data DATA to be stored in the memory device 200 and data DATA read therefrom may be transceived between the memory controller 100 and the memory device 200.

The memory cell array 210 may include a plurality of memory cells, and the plurality of memory cells may include, for example, flash memory cells. Hereinafter, embodiments are described in detail for the case in which the plurality of memory cells include NAND flash memory cells. However, the embodiment is not limited thereto. In some embodiments, the plurality of memory cells may include resistive memory cells such as resistive read-only memory (RAM) (RRAM), phase-change RAM (PRAM), and magneto-resistive RAM (MRAM).

In an example embodiment, the memory cell array 210 may include a three-dimensional (3D) memory cell array, the 3D memory cell array may include a plurality of NAND strings, and each NAND string may include the memory cells respectively connected to the word lines vertically stacked on a substrate. However, the embodiment is not limited thereto, and in some embodiments, the memory cell array 210 may include a two-dimensional (2D) memory cell array, and the 2D memory cell array may include the plurality of NAND strings arranged in row and column directions.

When a read command requesting a read from the memory controller 100 is provided to the memory device 200, the read operation may be performed based on a control of the control logic 230. As an example, when each memory cell stores a plurality of bits, the memory cells of the memory cell array 210 may include a plurality of threshold voltage distributions, and data including two or more bits may be read from each memory cell.

The voltage generator 220 may generate various voltages used in the memory device 200, and as an example, a program voltage for a program operation and a read voltage for the read operation may be generated. In addition, the voltage generator 220 may variously control levels of the program voltage and the read voltage based on the control of the control logic 230. For example, the voltage generator 220 may provide the read voltage having various levels for identifying the plurality of threshold voltage distributions. In addition, the read operation using one or more read levels may be performed for identifying any threshold voltage distribution, and according to an example embodiment, the plurality of read operations may be performed for identifying any one threshold voltage distribution, and the voltage generator 220 may change and output the level of the read voltage from the plurality of read operations described above based on a control of the voltage controller 231.

The control logic 230 may control an overall operation of the memory device 200, and as an example, based on the command CMD, the address ADDR, and the control signal CTRL, which are received from the memory controller 100, the control logic 230 may output various internal control signals for programming data in the memory cell array 210 or reading data from the memory cell array 210. In addition, the control logic 230 may also output a voltage control signal for controlling levels of various voltages, which are output by the voltage generator 220 in relation with the program operation, the read operation, and the erase operation.

According to an embodiment, when an error is detected in data read from the memory cell array 210, or an uncorrectable error occurs, the memory controller 100 may retry to read data from the memory cell array 210. For example, the memory controller 100 may perform various internal process operations for calculating an optimal read level for reducing an error occurrence, and in addition, may perform various control operations in relation with the read operation in the memory device 200 during a process of retrying to read.

According to an example embodiment, the read operation using the plurality of read levels may be performed in the process of retrying to read, and the optimal read level may be calculated based on data read by using the plurality of read levels described above. According to an embodiment, in relation with the optimal read level calculation, the memory device 200 may provide read data RD[1:M], which is read by using a plurality of (for example, M) read levels, to the memory controller 100. In addition, according to an example embodiment, the read data RD[1:M] may include data read by using at least four read levels, which have different levels from each other.

On the other hand, according to an example embodiment, the optimal read level may be calculated based on calculating counting values based on a counting result with respect to the read data RD[1:M] described above, and modeling of a plurality of cell count functions by using a combination of the calculated counting values. For example, the memory controller 100 may include a counting logic 130, and the counting logic 130 may perform a counting operation (for example, an on-cell or off-cell counting) on the read data RD[1:M] read by using the plurality of read levels. As an example, a counting value CNT[1:N] corresponding to N read levels may be generated by the counting logic 130. According to various embodiments, the number (for example, M) of read levels used for generating read data RD[1:M] and the number of calculated counting value CNT[1:N] may be the same as each other, or may also be different from each other. In other words, in embodiments, a generation operation of the counting value CNT[1:N] using the read data RD[1:M] may be variously implemented.

According to an embodiment, the memory controller 100 may include a read level calculation module 120. In addition, the calculated counting value CNT[1:N] may be provided to the read level calculation module 120. The read level calculation module 120 may calculate the optimal read level for identifying threshold voltage distribution based on the counting value CNT[1:N] and at least one piece of information, and the memory controller 100 may provide information related to the calculated optimal read level (hereinafter, referred to as read level information Info_ORL) to the memory device 200 so that data is read according to the calculated optimal read level. For example, the memory controller 100 may provide a control signal for controlling the level of the read voltage based on the calculated result, or a piece of information about the optimal read level may be provided to the memory device 200, and the memory device 200 may, based on the piece of information, also generate an internal control signal for controlling the level of the read voltage.

A detailed example of an operation in the example embodiment is described below.

When margins between adjacent threshold voltage distributions to each other are reduced, an error occurrence possibility may be high in a data read process, and when an error is detected or an uncorrectable error occurs, an operation (for example, defense code) for calculating the optimal read level between the adjacent threshold voltage distributions to each other described above may be performed.

The read level calculation module 120 may model one cell count function by using at least three counting values of N of the counting value CNT[1:N], and as an example, may model a second-degree function, which receives the read level as an input and outputs the counting value. In addition, when the counting value CNT[1:N] is equal to or greater than four, the read level calculation module 120 may model two or more cell count functions based on various combinations of the counting value CNT[1:N].

The read level calculation module 120 may select any one optimal cell count function of the plurality of modeled cell count functions. For example, the counting value (hereinafter, referred to as a function value or an estimated counting value), which receives each read level as an input, may be calculated by using each cell count function, and the optimal cell count function may be selected based on comparison of the counting value CNT[1:N] with the calculated estimated counting value. For example, with respect to each cell count function, N estimated counting values may be calculated by using N read levels corresponding to N of the counting value CNT[1:N], and based on a difference between the counting value CNT[1:N] and the calculated estimated counting value, a cell count function having a relatively least difference may be selected as the optimal cell count function. When the difference between the counting value CNT[1:N] and the estimated counting value is relatively small, it may be determined that the corresponding cell count function properly reflects the threshold voltage distribution of actual memory cells, and the optimal read level may be calculated based on the selected optimal cell count function.

According to an example embodiment described above, the plurality of cell count functions may be modeled by using the counting value CNT[1:N] corresponding to a plurality of different read levels from each other so that the plurality of cell count functions are modeled, and because the optimal cell count function is selected from the plurality of modeled cell count functions, an effect of the noise on the data read operation may be reduced. For example, even when the noise occurs at some of the plurality of read levels described above in the data read process, because the modeled cell count function is selected based on other read levels having relatively less noise effect, the optimal read level may be calculated even in the noise environment described above.

In addition, according to an example embodiment described above, interference between the memory cells may be increased due to process miniaturization of a memory device such as NAND, distances between threshold voltage distributions may be reduced according to an increase of the number of bits to be stored by each memory cell, and accordingly, a noise occurrence frequency and noise strength may be increased as the degree of integration of the memory device is increased, but the memory system 10 according to an example embodiment may calculate the optimal read level despite the noise environment.

On the other hand, in the embodiment described above, an example is illustrated, in which the counting value CNT[1:N] is generated in the memory controller 100, but the embodiment is not limited thereto. For example, when a counting logic is included in the memory device 200, a counting operation on data read by using the plurality of read levels may be performed by the memory device 200, and in the embodiment described above, the memory device 200 may also provide the counting value CNT[1:N] to the memory controller 100.

FIG. 2 is a block diagram of an implemented example of a read level calculation module 120 included in the memory controller 100 in FIG. 1.

Referring to FIGS. 1 and 2, the read level calculation module 120 may include a modeling module 121, an error comparison module 122, and an operation module 123, and various modules illustrated in FIG. 2 may be implemented as hardware or software, or may also be implemented as a combination of hardware and software. The hardware may include a hardware processor such as a CPU or an ASIC. As an example, when the read level calculation module 120 is implemented as software including firmware, the memory controller 100 may include a memory storing software, and the read level calculation module 120 may be loaded to the memory in a software form and executed by the processor 110. According to an example embodiment, the memory controller 100 may include a flash translation layer (FTL), and at least a portion of functions of the read level calculation module 120 may be included in the FTL.

The read level calculation module 120 may generate the read level information Info_ORL related with the optimal read level based on the counting value CNT[1:N] and at least one piece of information described above. The memory controller 100 may provide to the memory device 200 a voltage control signal for changing the level of the read voltage by processing the read level information Info_ORL, or the memory device 200 may receive the read level information Info_ORL and also generate the voltage control signal by processing the read level information Info_ORL.

The read level calculation module 120 may generate the read level information Info_ORL based on first information Info_RLN and second information Info_RL, together with the counting value CNT[1:N] described above. The first information Info_RLN may include information about the number of read levels corresponding to the counting value CNT[1:N], and the second information Info_RL may include information about the voltage level corresponding to the plurality of read levels. In an embodiment, the first information Info_RLN may also be defined as information about the number in the counting value CNT[1:N]. In other words, in the read level calculation module 120, the voltage levels corresponding to the read levels may correspond to inputs for modeling the cell count functions, and the cell count functions, in which the counting value CNT[1:N] corresponds to an output, may be modeled. In addition, when the cell count function corresponding to a second-order function is modeled, the cell count function may be modeled by using three read levels and counting values corresponding thereto, and the read level calculation module 120 may model the plurality of cell count functions by referring to information about the number of read levels.

On the other hand, the first information Info_RLN and the second information Info_RL described above may include information generated by the memory controller 100. For example, various conditions for calculating the optimal read level may be determined based on the performance of the read level calculation module 120, and the first information Info_RLN and the second information Info_RL may be generated based on the number of read levels used for calculating the optimal read level and determination of the voltage level.

The modeling module 121 may model the plurality of cell count functions as described above, and for example, may calculate coefficients of each of the plurality of cell count functions. A formula of a second-degree function may be defined as $y=ax^2+bx+c$, and the modeling module 121 may calculate a, b, and c as coefficients of each of the plurality of cell count functions. The coefficients a, b, and c may be calculated by substituting three arbitrarily selected read levels into x, and substituting counting values corresponding to the three arbitrarily selected read levels into y. In addition, because the three arbitrarily selected read levels of N read levels are selected and one cell count function is modeled, three read levels selected from the N read levels may have a plurality of combinations, and accordingly, the modeling module 121 may model the plurality of cell count functions.

The error comparison module 122 may select the optimal cell count function from the plurality of modeled cell count functions. For example, the error comparison module 122 may calculate a y value by substituting the read level into x of the plurality of modeled cell count functions, and the calculated y value may be referred to as the estimated counting value. For example, the error comparison module 122 may substitute the above-described N read levels into x for each cell count function, and accordingly, may calculate N estimated counting values as function values (or, the y value). In addition, according to an example embodiment, all of the above-described N read levels may be substituted for each cell count function, or only at least some of the N read levels may also be substituted.

The error comparison module 122 may compare the estimated counting value for each cell count function with the above-described counting value (CNT[1:N], hereinafter, referred to as an actual counting value). For example, of the plurality of cell count function models, a cell count function model, in which a difference between the estimated counting value and the actual counting value is small, may be determined to reflect optimally the threshold voltage distribution characteristics of the actual memory cells.

In selecting the optimal cell count function, when the N read levels are assumed to be substituted into each cell count function, the error comparison module 122 may calculate an error (for example, an average error) of the corresponding cell count function based on differences between the counting value CNT[1:N] and the N estimated counting value. The error comparison module 122 may select, as the optimal cell count function, the cell count function having the least average error of the plurality of cell count functions. The average error may be calculated by using various methods and formulas, and for example, a calculation operation may be performed based on a mean absolute error (MAE), a mean square error (MSE), etc.

On the other hand, the operation module 123 may calculate the optimal read level based on the selected optimal cell count function. For example, in the case of an x value (for example, a read level), which causes the y value to be least in the cell count function of a second-order function form, a small change of the cell count may be represented on left and right sides with the x value as a reference, and accordingly, the read level at a location, where a change of the cell count is small, may correspond to an optimal location, where two different adjacent threshold voltage distributions from each other are differentiated. Accordingly, in the optimal cell count function, a location of the x value causing the y value (or, the estimated counting value) least may be calculated as the optimal read level. For example, the optimal read level may be calculated by using a differential operation on a cell count function of a second-order function form, or by using an operation of calculating the least value of y.

Figure 3B:
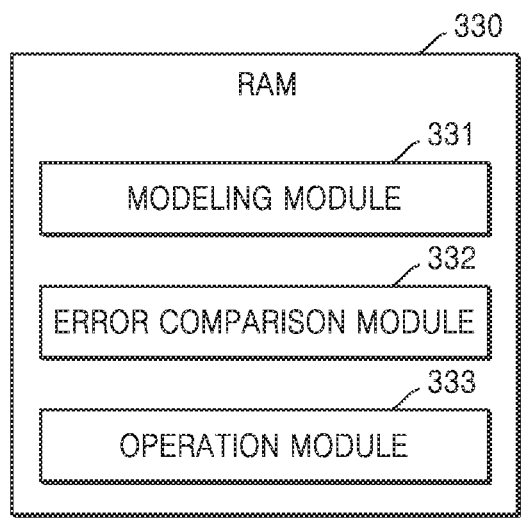

FIGS. 3A and 3B are block diagrams of implementation examples of a memory controller 300, according to an example embodiment.

Referring to FIGS. 3A and 3B, the memory controller 300 may include a host interface (I/F) 310, a processor 320, RAM 330, an error correction code (ECC) circuit 340, a buffer 350, a memory interface 360, and a counting (CNT) logic 370. In addition, the RAM 330 may be used as a working memory, and the processor 320 may control an overall operation of the memory controller 300 by executing firmware loaded on the RAM 330. The RAM 330 may be implemented as various memories, and for example, as at least one of a cache memory, dynamic RAM (DRAM), static RAM (SRAM), PRAM, and a flash memory device. In addition, the FTL may be loaded in RAM as an example of firmware, and various functions related with a flash memory operation may be performed by driving the FTL.

In the above-described embodiment, the read level calculation module may include a modeling module 331, an error comparison module 332, and an operation module 333, and when the read level calculation module, as firmware, is implemented in software, as illustrated in FIG. 3B, the modeling module 331, the error comparison module 332, and the operation module 333 may be loaded in the RAM 330 and executed by the processor 320. For example, the read level calculation module 120 may be stored in a memory device NVM in a non-volatile manner, and at an initial driving operation of the memory system 10, the read level calculation module 120 read from the memory device may be loaded in the RAM 330 of the memory controller 300.

The host I/F 310 may communicate with the host HOST via various types of I/F according to the above-described embodiment. In addition, the memory I/F 360 may provide a physical connection between the memory controller 300 and the memory device NVM. For example, commands/addresses, data, or the like may be transceived between the memory controller 300 and the memory device NVM via the memory I/F 360. Data requested to be written by the host HOST and data read from the memory device NVM may be temporarily stored in the buffer 350. In addition, the ECC circuit 340 may perform ECC encoding and decoding processes on the data requested to be written and the read data, and accordingly, errors of data may be detected and corrected.

The ECC circuit 340 may perform error detection and correction operations on data read from the memory device NVM, and when an error occurs or an error is not corrected, the read level calculation module 120 according to the embodiments described above may be executed. For example, a read operation using the plurality of read levels may be performed in the memory device NVM based on the control of the memory controller 300, the plurality of pieces of read data may be provided to the memory controller 300, and the CNT logic 370 may calculate the plurality of counting values corresponding to the plurality of read levels based on the counting operation on the received data. In addition, based on the execution of the read level calculation module 120, a modeling operation of the plurality of cell count functions, a calculation operation of the optimal cell count function, and a calculation operation of the optimal read level may be performed.

Figure 4:
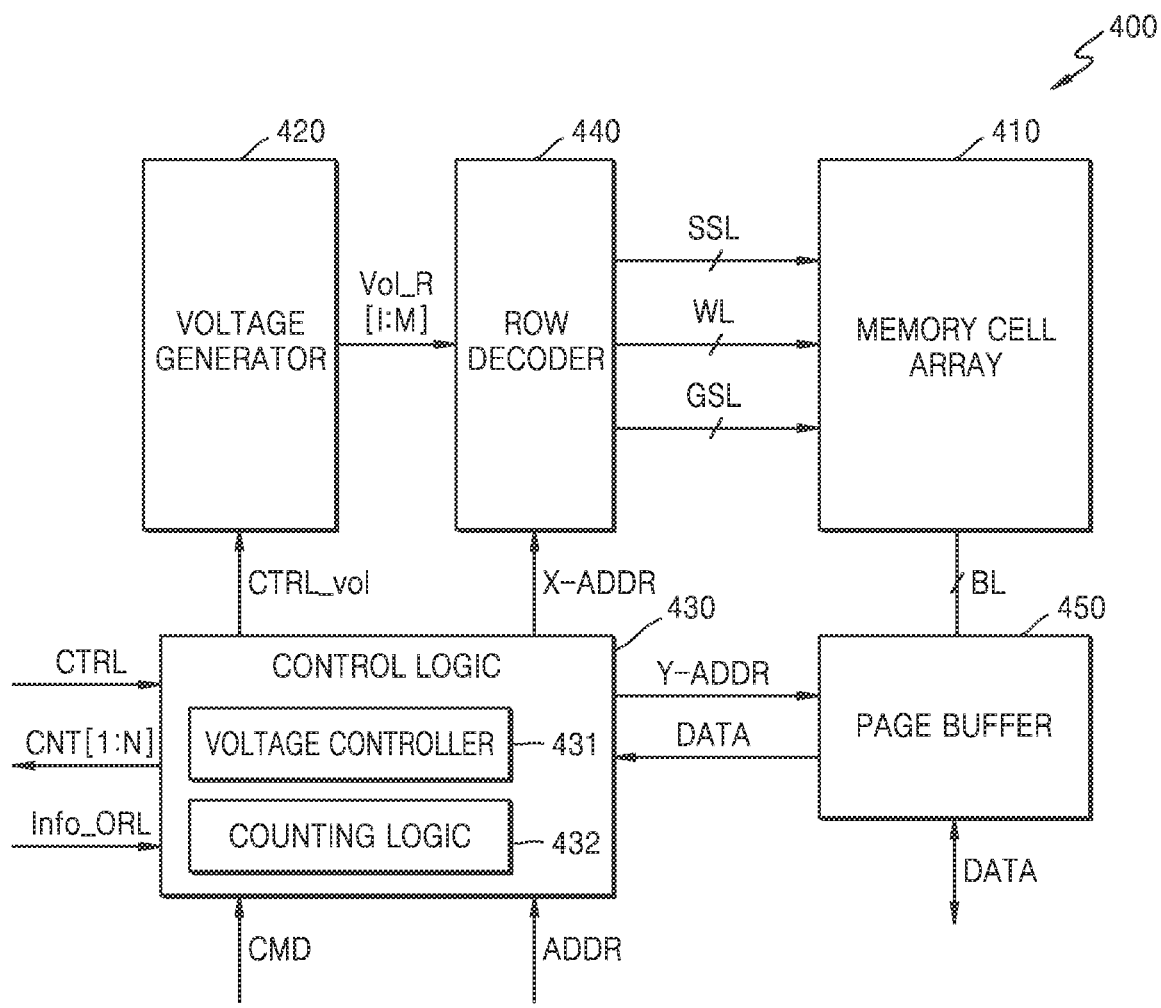
FIG. 4 is a block diagram of an implementation example of a memory device, according to an embodiment.

FIG. 4 is a block diagram of an implementation example of a memory device 400, according to an embodiment. FIG. 4 illustrates an implementation example of a flash memory device as a memory device.

Referring to FIG. 4, the memory device 400 may include a memory cell array 410, a voltage generator 420, a control logic 430, a row decoder 440, and a page buffer 450. Memory cells of the memory cell array 410 may be connected to word lines WL, string select lines SSL, ground select lines GSL, and bit lines BL. The memory cell array 410 may be connected to the row decoder 440 via word lines WL, string select lines SSL, and ground select lines GSL, and may be connected to the page buffer 450 via the bit lines BL. Each of the memory cells may store one or more bits, and for example, each memory cell may correspond to a multi-level cell (MLC), a triple-level cell (TLC), or a quad-level cell (QLC).

The control logic 430 may output various internal control signals for controlling program, read, and erase operations of the memory cell array 410, based on the command CMD, the address ADDR, and the control signal CTRL received from the memory controller. As an example, the control logic 430 may include a voltage controller 431, output a voltage control signal CTRL_vol for controlling levels of various voltages generated by the voltage generator 420, provide a row address X-ADDR to the row decoder 440, and provide a column address Y-ADDR to the page buffer 450.

The control logic 430 may output the voltage control signal CTRL_vol so that a plurality of read operations are performed at different read levels for calculating the optimal read level, and the voltage generator 420 may generate a plurality of read voltages Vol_R[1:M] based on the voltage control signal CTRL_vol. As an example, the control logic 430 may output the voltage control signal CTRL_vol so that the read level is changed according to a certain level interval with any one read level as a start location. In addition, the control logic 430 may receive the read level information Info_ORL including information about the optimal read level calculated according to the embodiment described above, and may control the voltage generator 420 so that data is read according to the optimal read level.

According to an embodiment, the control logic 430 may include a counting logic 432. For example, the memory system may also be implemented so that the counting value CNT[1:N] corresponding to the plurality of read levels described in the embodiment described above is generated by the memory device 400 and provided to the memory controller. According to various embodiments, the number of read voltages Vol_R[1:M] and the counting values CNT[1:N] may also be implemented as the same as each other, or may also be implemented as different from each other. In other words, a read operation using the plurality of read levels according to embodiments and a calculation operation of the counting value based on the read operation may be implemented in various forms, and an implementation example is described later.

Figure 5:
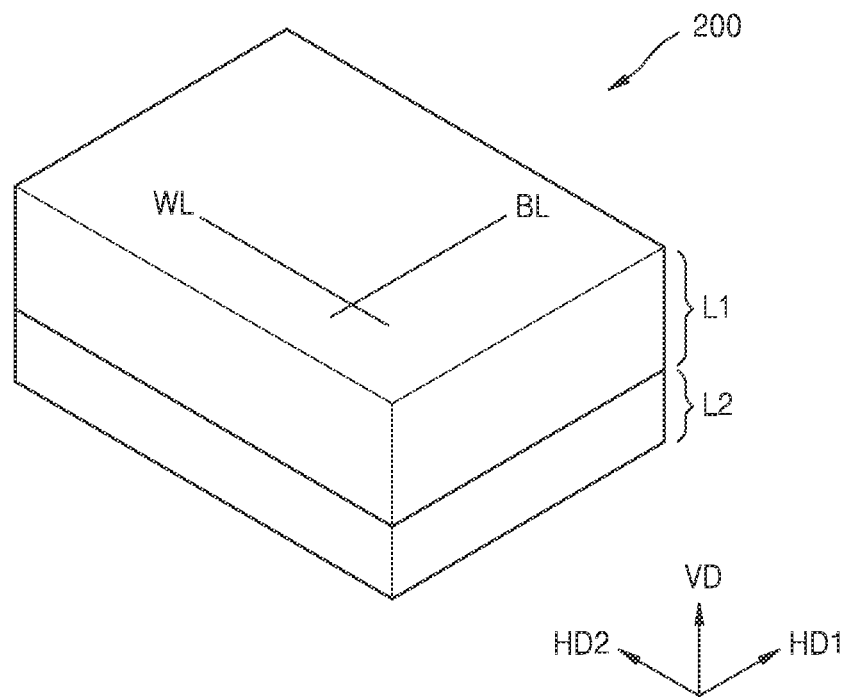
FIG. 5 is a schematic diagram of a structure of a memory device of FIG. 1, according to an embodiment.
Figure 6:
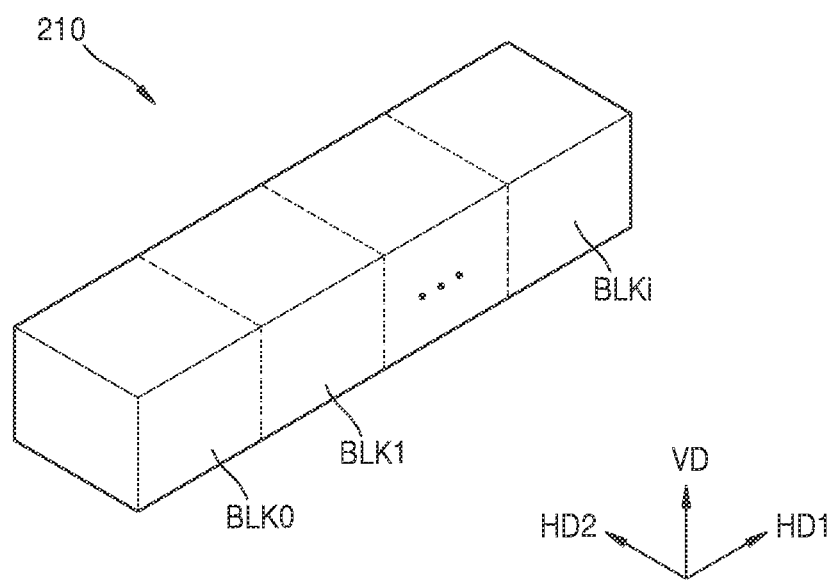
FIG. 6 is an exemplary diagram of a memory cell array in FIG. 1.
Figure 7:
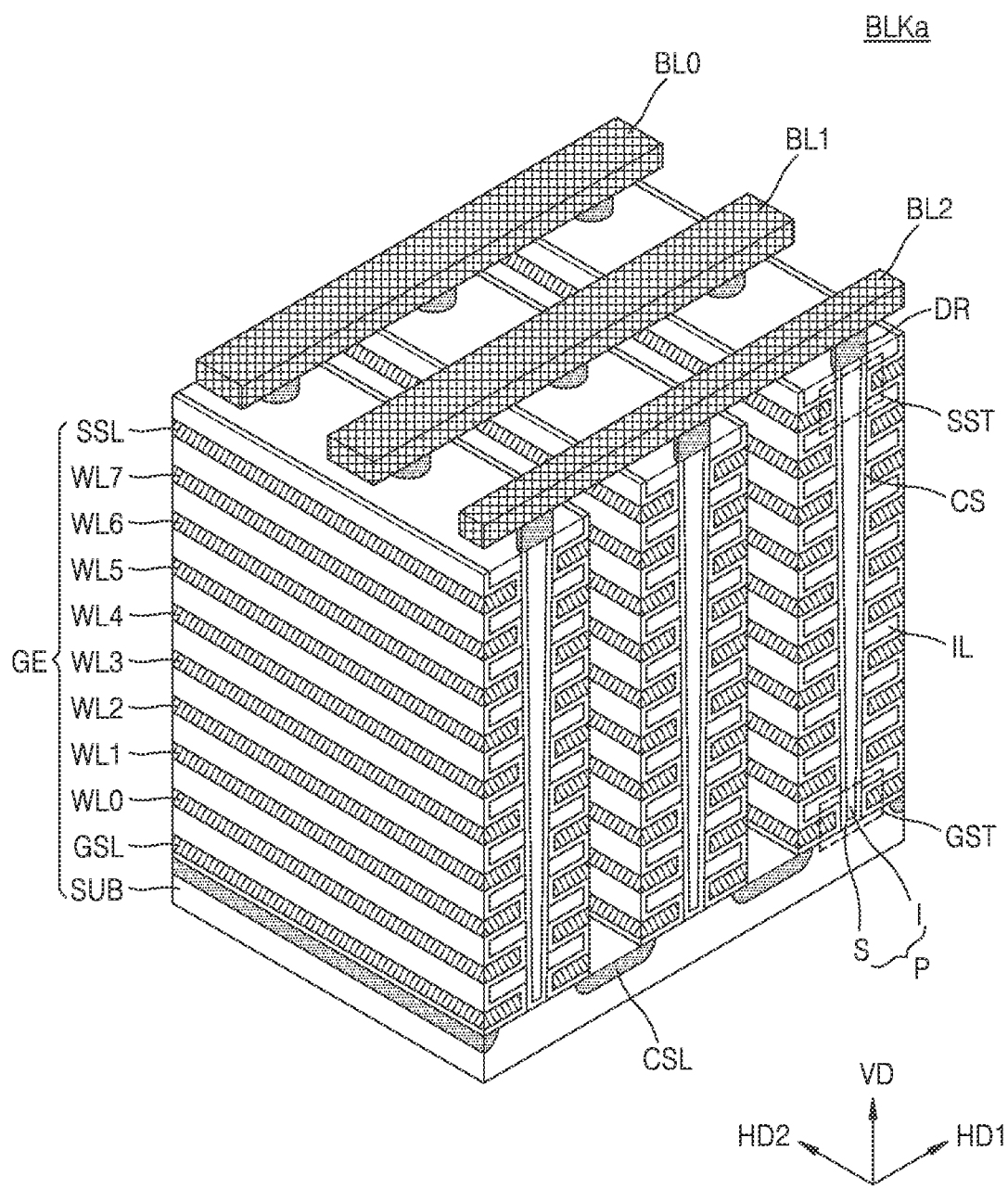
FIG. 7 is a perspective view of an example of a structure of a memory block of FIG. 6.

FIG. 5 is a schematic diagram of a structure of the memory device 200 in FIG. 1, FIG. 6 is an example diagram of the memory cell array 210 in FIG. 1, and FIG. 7 is a perspective diagram of an example of a structure of a memory block BLKa in FIG. 6. In FIG. 5, a cell over periphery (COP) structure is illustrated as an implementation example of a memory device, but the embodiments are not limited thereto, and a memory device may also be implemented in various structures.

Referring to FIG. 5, the memory device 200 may include a first semiconductor layer L1 and a second semiconductor layer L2, and the first semiconductor layer L1 may be stacked in a vertical direction VD with respect to the second semiconductor layer L2. The second semiconductor layer L2 may be arranged under the first semiconductor layer L1 in the vertical direction VD, and accordingly, the second semiconductor layer L2 may be arranged close to a substrate.

In an embodiment, the memory cell array 210 in FIG. 1 may be formed in the first semiconductor layer L1, and other periphery circuits in FIG. 1 may be formed in the second semiconductor layer L2. Accordingly, the memory device 200 may have a structure in which the memory cell array 210 is arranged on the periphery circuit, that is, the COP structure. The COP structure may effectively reduce an area thereof in a horizontal direction, and improve a degree of integration of the memory device 200.

In an embodiment, the second semiconductor layer L2 may include the substrate, and by forming transistors and metal patterns for wiring the transistors on the substrate, the periphery circuit may be formed in the second semiconductor layer L2. After the periphery circuit is formed in the second semiconductor layer L2, the first semiconductor layer L1 including the memory cell array 210 may be formed, and the metal patterns for connecting the word lines WL and the bit lines BL of the memory cell array 210 to the periphery circuit formed in the second semiconductor layer L2 may be formed. For example, the bit lines BL may extend in a first horizontal direction HD1, and the word lines WL may extend in a second horizontal direction HD2.

On the other hand, referring to FIG. 6, the memory cell array 210 may include first through $i^{th}$ memory blocks BLK0 through BLKi, wherein i is a positive integer. Each of the first through $i^{th}$ memory blocks BLK0 through BLKi may have a three-dimensional structure (or a vertical structure). Each of the first through $i^{th}$ memory blocks BLK0 through BLKi may include a plurality of NAND strings extending in the vertical direction VD. In this case, the plurality of NAND strings may be provided apart from each other by a certain distance in first and second horizontal directions HD1 and HD2. The first through $i^{th}$ memory blocks BLK0 through BLKi may be selected by the row decoder (240 in FIG. 1). For example, the row decoder 240 may select a memory block corresponding to a block address from the first through $i^{th}$ memory blocks BLK0 through BLKi. An example memory block, memory BLKa, is shown in FIG. 7.

Referring to FIG. 7, the memory block BLKa may be formed in a direction perpendicular to a substrate SUB. The substrate SUB may be of a first conductivity type (for example, a p-type), and a common source line CSL that extends on the substrate SUB in the second horizontal direction HD2 and is of a second conductivity type (for example, an n-type) may be provided. In a region between two adjacent common source lines CSL on the substrate SUB, a plurality of insulating layers IL, which extend in the second horizontal direction HD2, may be sequentially provided in the vertical direction VD, and the plurality of insulating layers IL may be apart from each other by a certain distance in the vertical direction VD. For example, the plurality of insulating layers IL may include an insulating material such as silicon oxide.

On a region of the substrate SUB between two adjacent common source lines CSL, a plurality of pillars P, which are arranged sequentially in the first horizontal direction HD1, and penetrate the plurality of insulating layers IL in the vertical direction VD, may be provided. For example, the plurality of pillars P may penetrate the plurality of insulating layers IL and contact the substrate SUB. A surface layer S of each pillar P may include a silicon material of the first type, and may function as a channel region. An inner layer I of each pillar P may include an insulating material such as silicon oxide or an air gap.

In the region between two adjacent common source lines CSL, a charge storage layer CS may be provided along exposed surfaces of the insulating layers IL, the pillars P, and the substrate SUB. The charge storage layer CS may include a gate insulating layer (or, referred to as a tunneling insulating layer), a charge trap layer, and a blocking insulating layer. For example, the charge storage layer CS may have an oxide-nitride-oxide (ONO) structure. In addition, in the region between two adjacent common source lines CSL, a gate electrode GE including the select lines (for example, GSL and SSL) and word lines WL0, WL1, WL2, WL3, WL4, WL5, WL6 and WL7 may be provided on an exposed surface of the charge storage layer CS.

Drains or drain contacts DR may be respectively provided on the plurality of pillars P. For example, the drains or drain contacts DR may include a silicon material doped with impurities of the second conductivity type. On the drain contacts DR, bit lines BL0, BL1 and BL2 extending in the first horizontal direction HD1 and being apart from each other by a certain distance in the second horizontal direction HD2 may be provided.

Figure 8A:
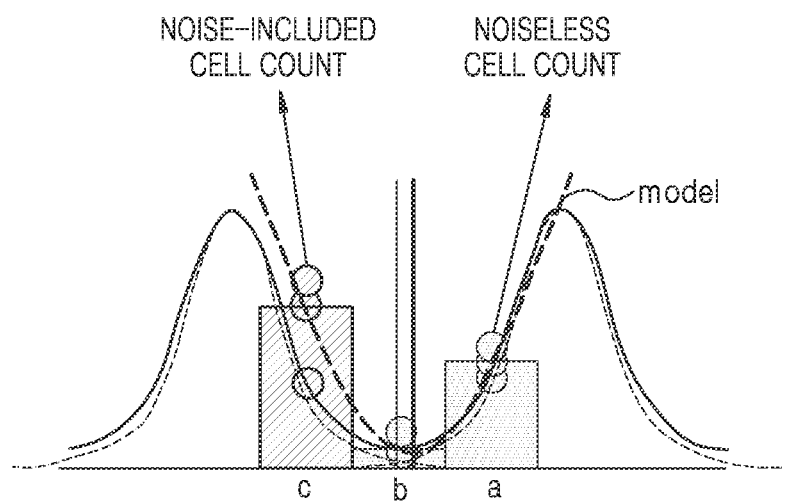
FIGS. 8A and 8B are diagrams of modeling examples of a cell count function for the case where the embodiments are not applied and for the case where the embodiments are applied, respectively.
Figure 8B:
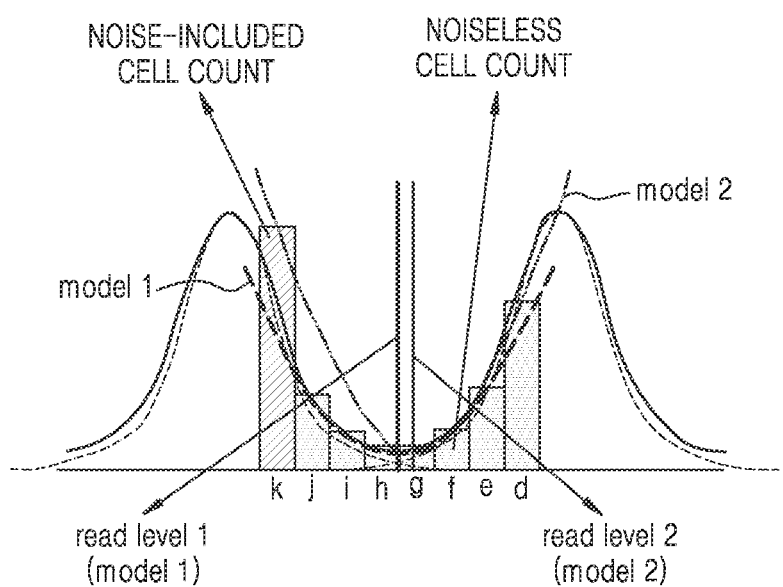

FIGS. 8A and 8B are diagrams of modeling examples of a cell count function for the case where the embodiments are not applied and for the case where the embodiments are applied, respectively.

Referring to FIG. 8A, a case is illustrated in which one cell count function is modeled by using three particular read levels without applying the embodiment, and for example, one cell count function may be modeled based on a cell counting value at a read level at a location a, a cell counting value at a read level at a location b, and a cell counting value at a read level at a location c. In this case, when noise occurs in the read operation using the read level at the location c, the cell counting value at the read level of the location c may have a different value from a cell counting value, which is determined as normal in the case of no noise, and in the example illustrated in FIG. 8A, a case is illustrated in which the cell counting value at the read level of the location c is greater than a counting value in a normal case.

As illustrated in FIG. 8A, the plurality of read operations may be performed at each read level in response to the noise environment described above, and a method, in which an average value of the plurality of cell counting values calculated in this manner is defined as a cell counting value at a corresponding read level may be applied, but because, even in this method, the cell counting value calculated in the noise environment is used for calculating the optimal read level, there may be a limit in reducing the noise effect.

On the other hand, according to an embodiment illustrated in FIG. 8B, the cell counting value corresponding to each of the plurality of read levels (for example, d through k) may be calculated, and the number of read levels (for example, d through k) may be four or more. In addition, in an embodiment, only one read operation for one read level may be performed, and accordingly, one cell counting value may be calculated in correspondence to one read level.

In the embodiment illustrated in FIG. 8B, assuming that noise occurs in a read operation using the read level k, a cell count function not using the cell counting value corresponding to the read level k (for example, a first model) may be modeled, and in addition, a cell count function using the cell counting value corresponding to the read level k (for example, a second model) may be modeled. As illustrated in FIG. 8B, the cell count function according to the first model may have a small difference between an actually calculated cell counting value and an estimated counting value by using a function value. On the other hand, the cell count function according to the second model may have a relatively large difference between a cell counting value actually calculated at some of the plurality of read levels (for example, read levels adjacent to the read level in which the noise has occurred) and the estimated counting value by using a function value.

As illustrated by the non-limiting examples of FIGS. 8A and 8B, a small change in read voltage (x-axis) causes some memory cells change from being read as storing one binary value (such as logic 0) to another binary value (such as logic 1). This is a non-linear response to the change in read voltage. The measurements are noisy. When noise is present in a non-linear measurement, overall performance might be improved by removing some data samples. For a second order function, only three points are needed to specify the function and FIG. 8B illustrates eight points available (d, e, f, g, h, i, j, k). A different model is obtained for each unique triplet selected from (d, . . . , k). In this example, the number of different models is the number of ways of picking three points from eight points, and $$\binom{8}{3} = 56$$

different models (using "n choose k") are possible, in a non-limiting example.

In FIG. 8A, the data samples at read voltage c degrade the quality of a predicted model. In FIG. 8B, data samples at the read voltage k lead to model 2 (using point k) being a poorer model than model 1 (not using read voltage k). In some embodiments, the data samples at the read voltage k are removed by recognizing that model 1 is better. Model 1 can be recognized as better by comparing model 1 with all counts for the read voltages in the set (d, e, . . . , k) and retaining an error measure. When the error measure is better for model 1 than for any other model, then model 1 is retained. By this process, in this example, the cell counts at read voltage k of FIG. 8B have not been used in shaping model 2, although the cell counts at read voltage k may be part of the overall data used in determining the error measure.

According to an example embodiment, an optimal cell count model may be selected from a plurality of cell count models based on the difference between the actually calculated cell counting value and the estimated counting value by using the function value. In the example of FIG. 8B, the first model may be selected as the optimal cell count model, and the optimal read level (for example, a first read level RL1) may be calculated based on the selected cell count model. In other words, when the optimal read level is calculated from the cell count function according to the second model, a second read level RL2 may correspond to the optimal read level, but in the example of FIG. 8B, a case is illustrated in which the first read level RL1 calculated according to embodiments has a more accurate value than the second read level RL2.

Figure 9:
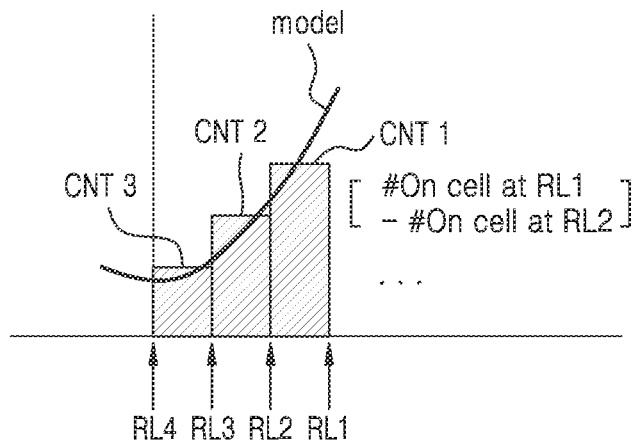
FIG. 9 is a diagram of an example of calculating a cell counting value, according to various embodiments.

FIG. 9 is a diagram of an example of calculating a cell counting value, according to various embodiments. In FIG. 9, three cell counting values CNT1, CNT2, and CNT3 corresponding to three read levels are illustrated.

In the embodiments, each cell counting value may correspond to a difference value between the number of on cells (or, off cells) at any one read level and the number of on cells (or, off cells) at another read level. For example, a first counting value CNT1 may correspond to a value obtained by subtracting the number of on cells for the case of reading data at the second read level RL2 from the number of on cells for the case of reading data at the first read level RL1. Similarly, a second counting value CNT2 may correspond to a value obtained by subtracting the number of on cells in the case of reading data at a third read level RL3 from the number of on cells in the case of reading data at the second read level RL2.

Considering the threshold voltage distribution of memory cells, memory cells having the threshold voltage on the left side of a certain read level as a reference (or, when the threshold voltage is less than a read level) may correspond to on cells, and memory cells having the threshold voltage on the right side of a certain read level as a reference (or, when the threshold voltage is greater than a read level) may correspond to off cells. Accordingly, when a read operation is performed while the read level is lowered by a certain interval, the number of on cells may be calculated less than the case in which the read level is raised. Accordingly, the first counting value CNT1 and the second counting value CNT2 illustrated in FIG. 9 may each have values equal to or greater than about 0.

On the other hand, when data is read by using the optimal read level between two threshold voltage distributions, a data error may be reduced. For example, when data is read by using two adjacent read levels at a location where the two threshold voltage distributions are accurately determined, the numbers of on cells determined by using the two adjacent read levels may be the same as or similar to each other, and accordingly, the counting value calculated by applying the method of FIG. 9 may have the least value. As an example, it may be assumed that a third counting value CNT3 corresponding to a value obtained by subtracting the number of on cells for the case of reading data at a fourth read level RL4 from the number of on cells for the case of reading data at the third read level RL3 has the least value.

In the embodiments described above, a counting value corresponding to a read level may be variously defined. For example, any one of the first read level RL1 and the second read level RL2 may be defined as the read level corresponding to the first counting value CNT1. Alternatively, any one read level between the first read level RL1 and the second read level RL2 may be defined as the read level corresponding to the first counting value CNT1, or an average level of the first read level RL1 and the second read level RL2 may also be defined as the read level corresponding to the first counting value CNT1.

On the other hand, when the optimal cell count function is selected according to the above-described embodiments, the optimal read level may be selected from the selected cell count function. When the cell count function of the model illustrated in FIG. 9 corresponds to the optimal cell count function, and a function value has the least value in the case where the read level corresponding to the third counting value CNT3 is substituted into the optimal cell count function, the calculated optimal read level may have a third read level RL3 or the fourth read level RL4, or a value between the third read level RL3 and the fourth read level RL4.

On the other hand, the counting value may be variously defined and calculated as described above, and in the embodiment illustrated in FIG. 9, the first counting value CNT1 calculated based on the first and second read levels RL1 and RL2 may be defined as corresponding to the first read level RL1 (or, the second read level RL2), and the second counting value CNT2 calculated based on the second and third read levels RL2 and RL3 may be defined as corresponding to the second read level RL2 (or, the third read level RL3). In this case, in the calculation of N counting values, (N+1) read operations by using (N+1) read levels may be performed.

Figure 10:
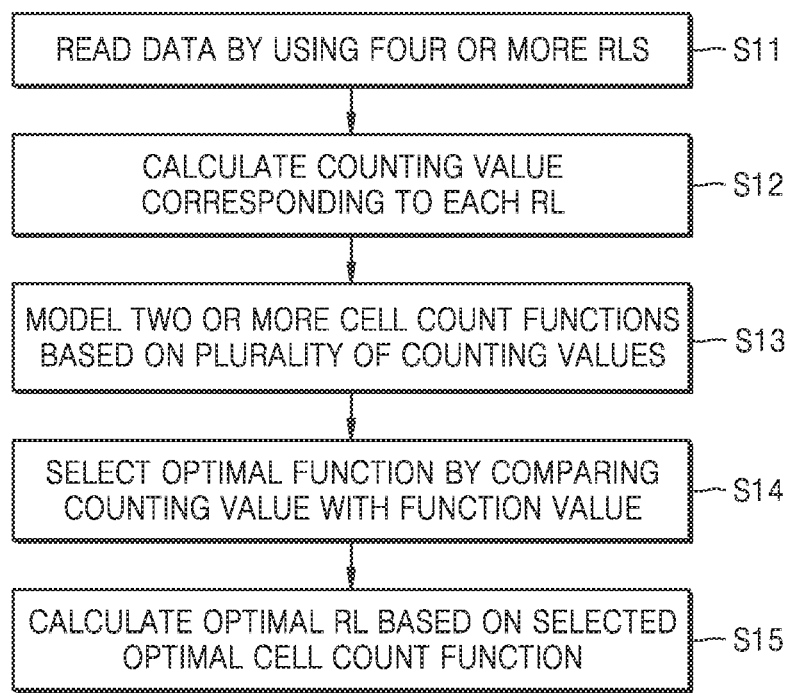
FIGS. 10 and 11 are flowcharts of an operating method of a memory system, according to example embodiments.
Figure 11:
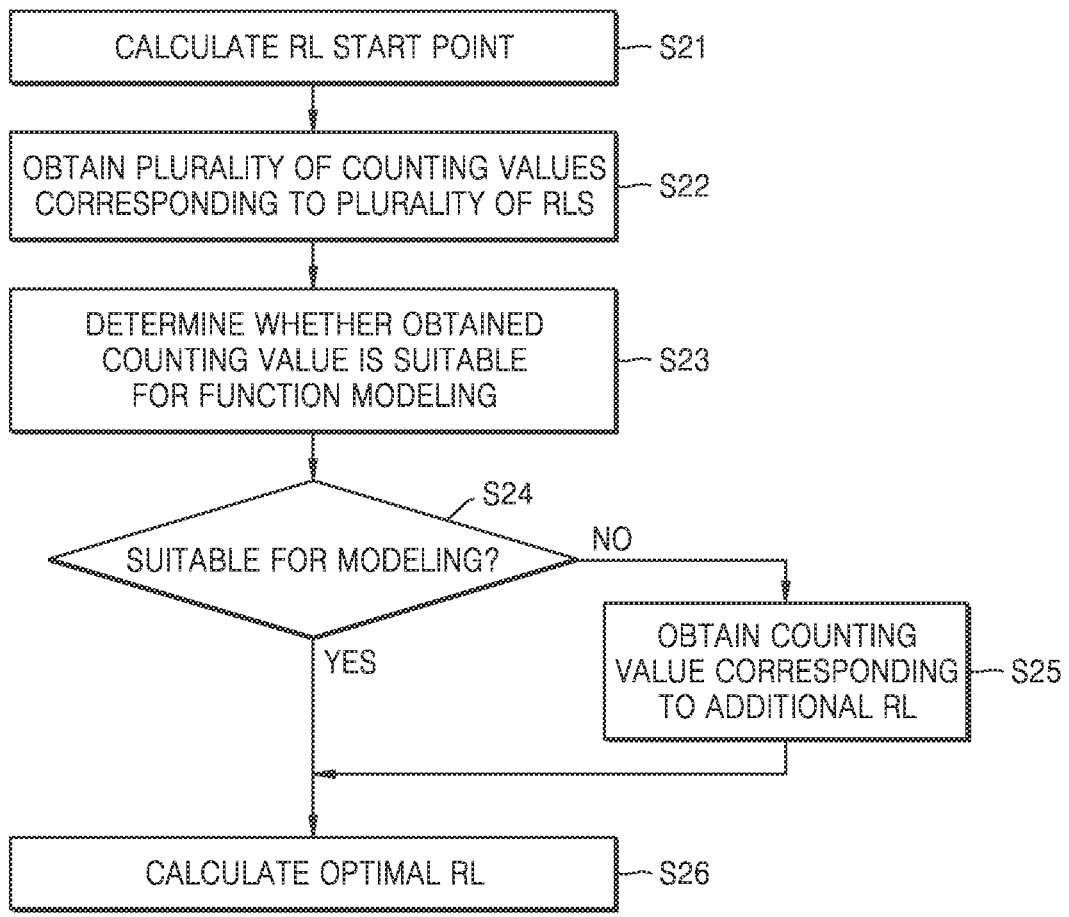

FIGS. 10 and 11 are flowcharts of an operating method of a memory system, according to example embodiments.

Referring to FIG. 10, a memory system may include a memory controller and a memory device (for example, a flash memory device), and when an error is detected or an uncorrectable error occurs in data read from a certain read unit of the memory device, an optimal read level calculation operation based on a cell count function modeling according to the embodiments may be performed. For example, data may be read by using four or more different read levels RL from each other for the read unit (S11).

The memory device may calculate a counting value by using an on cell (or, off cell) counting operation based on data read by using the four or more different read levels RL from each other (S12). According to the embodiment described above, the counting value may be variously calculated, and the counting value may correspond to a difference value between the numbers of on cells determined by using two adjacent read levels to each other. In addition, the read level corresponding to the calculated counting value may correspond to any one of the two read levels, or may correspond to any one level between the two read levels.

When the counting value is calculated in this manner, two or more cell count functions may be modeled based on the plurality of calculated counting values (S13). For example, when the cell count function is modeled into a second-degree function, three coefficients of the cell count function may be calculated based on three read levels and the counting values corresponding thereto.

In addition, for each of the plurality of modeled cell count functions, an estimated counting value may be calculated as a value of the modeled cell count function with the read level as an input, and the optimal cell count function may be selected by comparing the calculated counting value with the function value (or, the estimated counting value) (S14). For example, when there are eight read levels for each cell count function and eight counting values corresponding thereto, function values having the eight read levels as inputs for each cell count function may be calculated, and the optimal cell count function may be selected based on a result of comparing the above-described eight counting values with the function values calculated from the cell count function. According to an embodiment described above, the comparison operation may be performed by applying various operations such as an MAE or an MSE to an error (or, a difference) between the counting value and the function value.

When the optimal cell count function is selected as described above, the optimal read level may be calculated based on the selected cell count function (S15), and as an example, as described above, various calculation methods, in which the read level having an output value of the cell count function as the least value is calculated, or the read level having a differential value, which is obtained by differentiating the cell count function, as zero is calculated, or the like, may be used for calculating the optimal read level.

On the other hand, in the above-described embodiments, the cell count function is illustrated based on a second-degree function, but the embodiments are not necessarily limited thereto. For example, a function may also be modeled in a third-degree or fourth-degree function based on more read levels and the counting values corresponding thereto, or a function of other various forms may be modeled. In this case, various numbers of read levels according to the embodiments may be set at various locations, and in addition, an operation of calculating the counting value based on the read levels may be variously performed according to a type of modeling function.

On the other hand, referring to FIG. 11, when an error occurs or an error is uncorrectable in data read from the memory device, the memory controller may calculate the optimal read level according to the above-described embodiments and control a read retry operation for reading data. For example, a control operation may be performed so that data is read by using a plurality of read levels for calculating a plurality of counting values, and as an example, an operation for setting the plurality of read levels may be performed. For example, a start time point of the read level is calculated (S21), and the read level may be adjusted according to a certain interval from the start time point.

When the memory controller calculates the counting values, the memory controller may receive data read by using the plurality of read levels, and obtain the plurality of counting values corresponding to the plurality of read levels based on the counting operation (for example, a counting operation of the number of on cells in the above-described embodiment) (S22). In addition, the memory controller may determine whether the obtained counting value is suitable for modeling of the cell count function according to embodiments (S23).

Whether the obtained counting value is suitable for the modeling of the cell count function may be implemented in various methods, and for the modeling of a second-degree function as an example, whether the read levels and the counting value corresponding thereto have proper values of a second-degree function form may be determined. For example, in the case of a second-degree function, the form may be symmetrical to a certain read level having the least value as a reference, and whether the obtained counting value has a symmetrical form with respect to the read level as a reference may be determined.

When, as a result of determination (S24), the form is determined as not suitable for the modeling, an additional counting value may be obtained based on the read data by using the additionally selected read levels (S25). On the other hand, when the modeling is determined as suitable, the plurality of cell count functions may be modeled according to the above-described embodiments, and the optimal read level may be calculated based on the optimal cell count function selected from the plurality of modeled cell count functions (S26).

FIG. 12 illustrates diagrams of examples of determining whether modeling is suitable and obtaining additional counting values in the embodiment of FIG. 11.

Referring to FIG. 12, the counting values corresponding to the plurality of read levels may be calculated, and it may be necessary to set a proper number of read levels on the left and right sides with the optimal read level as a reference and calculate the counting values corresponding thereto for calculating the optimal cell count function of a second-degree function form. In the above-described embodiment, determination of whether the calculated cell counting values are suitable for the cell count function model may be performed, with the read level corresponding to the least counting value as a reference, based on comparison of the counting values corresponding to the read levels on the right side of the least counting value with the counting values corresponding to the read levels on the left side of the least counting value.

For example, by comparing counting values $CNT\_a$ and $CNT\_b$ corresponding to some of the read levels on the right side with a counting value $CNT\_c$ corresponding to some of the read levels on the left side, the case in which the counting value $CNT\_c$ is much less than the counting values $CNT\_a$ and $CNT\_b$ (or, when a difference exceeds a certain threshold) may be determined as unsuitable for the function modeling. In this case, additional read operation using other read levels based on the control of the memory controller may be performed, and additional counting values $CNT\_d$, $CNT\_e$, and $CNT\_f$ may be calculated based on the counting operation on additionally read data. In this manner, the counting values suitable for modeling of the cell count function may be calculated, and based on the result, a selection operation of the optimal cell count function and a calculation operation of the optimal read level may be performed.

Figure 13:
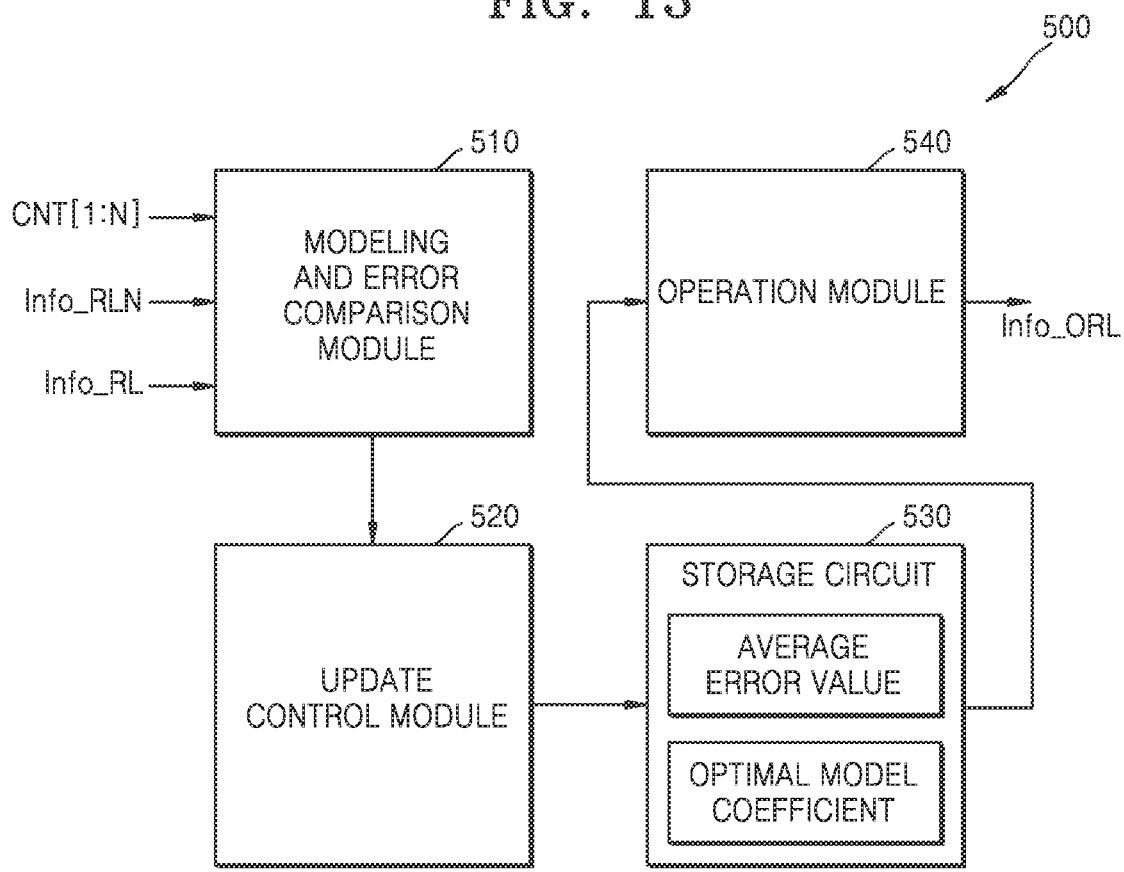
FIG. 13 is a block diagram of an implementation example of a memory controller, according to an example embodiment.

FIG. 13 is a block diagram of an implementation example of a memory controller 500, according to an example embodiment.

Referring to FIG. 13, the memory controller 500 may include a modeling and error comparison module 510, an update control module 520, a storage circuit 530, and an operation module 540. Each of the modeling and error comparison module 510, the update control module 520, and the operation module 540 may be implemented as hardware or software, or a combination thereof. In addition, at least some of components illustrated in FIG. 13 may include components included in the read level calculation module 120.

The modeling and error comparison module 510 may model the plurality of cell count functions based on the counting value CNT[1:N], the first information Info_RLN, and the second information Info_RL in the above-described embodiments, and in addition, the error comparison operation in the above-described embodiments for selecting the optimal cell count function may be performed. The modeling and error comparison module 510 may provide, to the update control module 520, information about the coefficient values (or model coefficients) of each cell count function and the error comparison result calculated from the corresponding cell count function.

The update control module 520 may perform an information update operation on the storage circuit 530 based on the information provided by the modeling and error comparison module 510. For example, the update control module 520 may receive an average error value related with each cell count function and model coefficient, and when the average error value is less than an existing error value stored in the storage circuit 530, the model coefficient corresponding to the corresponding cell count function may be updated as the optimal model coefficient in the storage circuit 530, and in addition, the average error value corresponding to the cell count function may be updated in the storage circuit 530.

According to the updated control operation, the information stored in the storage circuit 530 may correspond to information about the optimal cell count function, and the operation module 540 may calculate the optimal read level by applying the operation process using the optimal cell count function based on the information stored in the storage circuit 530, and may output the read level information Info_ORL related thereto.

Figure 14:
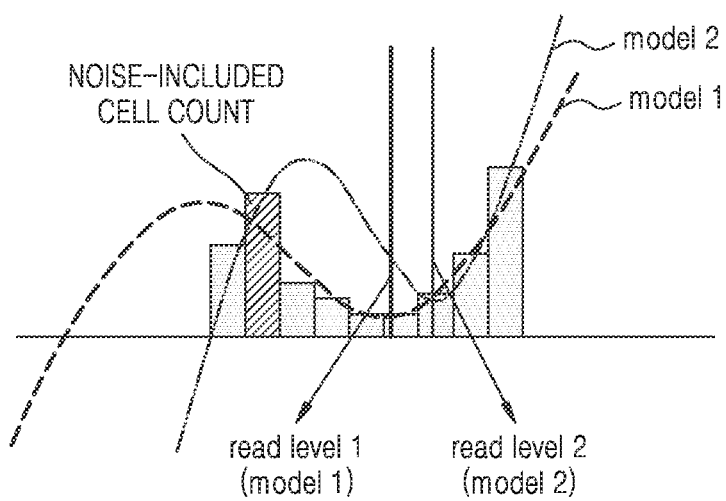
FIG. 14 is a diagram of the case in which a cell count function is modeled as a three-dimensional function in the embodiments.

FIG. 14 is a diagram of the case in which a cell count function is modeled as a three-dimensional function in the embodiments. In FIG. 14, a modeling of a three-dimensional function is illustrated as an example, but as described above, the embodiments may also be modeled in various types of functions.

When a plurality of bits per cell are stored in the memory cells, in a process of searching for the optimal read level of a distribution (for example, an erase status) at a particular location according to the threshold voltage distribution, the counting value calculated according to the above-described embodiments may have asymmetrical form. Accordingly, as illustrated in FIG. 14, in a read process for a particular threshold voltage distribution, a modeling of a second-degree function form may not be suitable for calculation of the optimal read level, and may need to be modeled in a three-degree function form.

For modeling of a three-degree function form, one cell count function may be modeled based on four read levels selected from the plurality of read levels and the counting value corresponding thereto, and in addition, because counting values corresponding to at least five or more read levels are calculated according to the embodiments, two or more cell count functions may be modeled. In the embodiment illustrated in FIG. 14, a cell count function (for example, the first model) modeled by using the counting value not including noise and a cell count function (for example, the second model) modeled by using the counting value including noise are illustrated, and in addition, a case is illustrated in which a first read level is selected as the optimal read level when the first model is selected as the optimal cell count function. In addition, a case is illustrated in which the first read level calculated based on the first model has a higher accuracy than a second read level calculated based on the second model.

Figure 15:
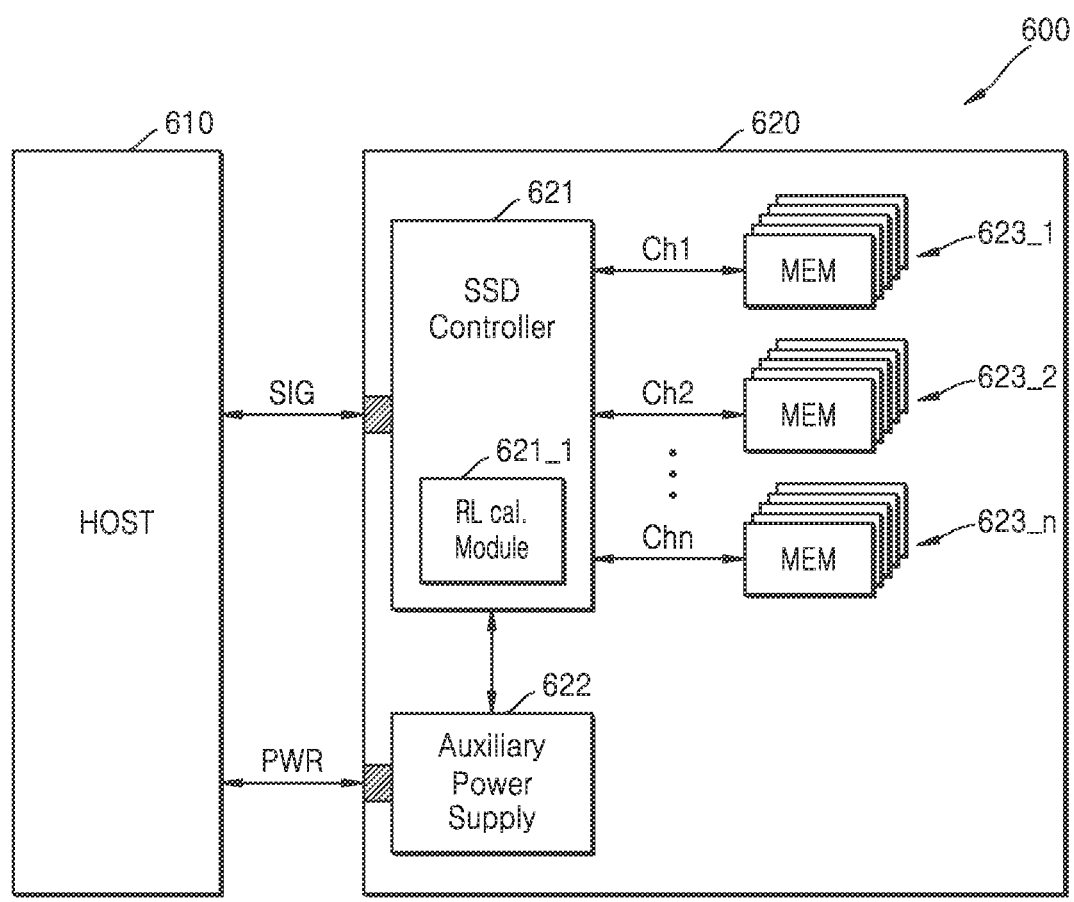
FIG. 15 is a block diagram of an example in which a memory system according to the embodiments is applied to a solid state drive (SSD) system.

FIG. 15 is a block diagram of an example in which the memory system 10 according to the embodiments is applied to an SSD system 600.

Referring to FIG. 15, the SSD system 600 may include a host 610 and an SSD 620. The SSD 620 may exchange a signal SIG with the host 610 via a signal connector, and receive power PWR via a power connector. The SSD 620 may include an SSD controller 621, an auxiliary power supply 622, and non-volatile memory devices (MEMs) 623_1 through 623_n. The MEMs 623_1 through 623_n may include NAND flash memories and may be connected to a plurality of channels Ch1~Chn. In this case, the SSD 620 may be implemented by using the embodiments described above with reference to FIGS. 1 through 14. In other words, the SSD controller 621 included in the SSD 620 may include a read level calculation module (RL cal. module) 621_1 according to the above-described embodiments, and the RL cal. module 621_1 may control an optimal read level calculation operation on the MEMs 623_1 through 623_n. According to the above-described embodiments, the SSD controller 621 may perform a calculation operation of the counting value based on a plurality pieces of data read from the MEMs 623_1 through 623_n, a modeling operation of the plurality of cell count functions, and the optimal read level calculation operation based on the optimal cell count function.

Figure 16:
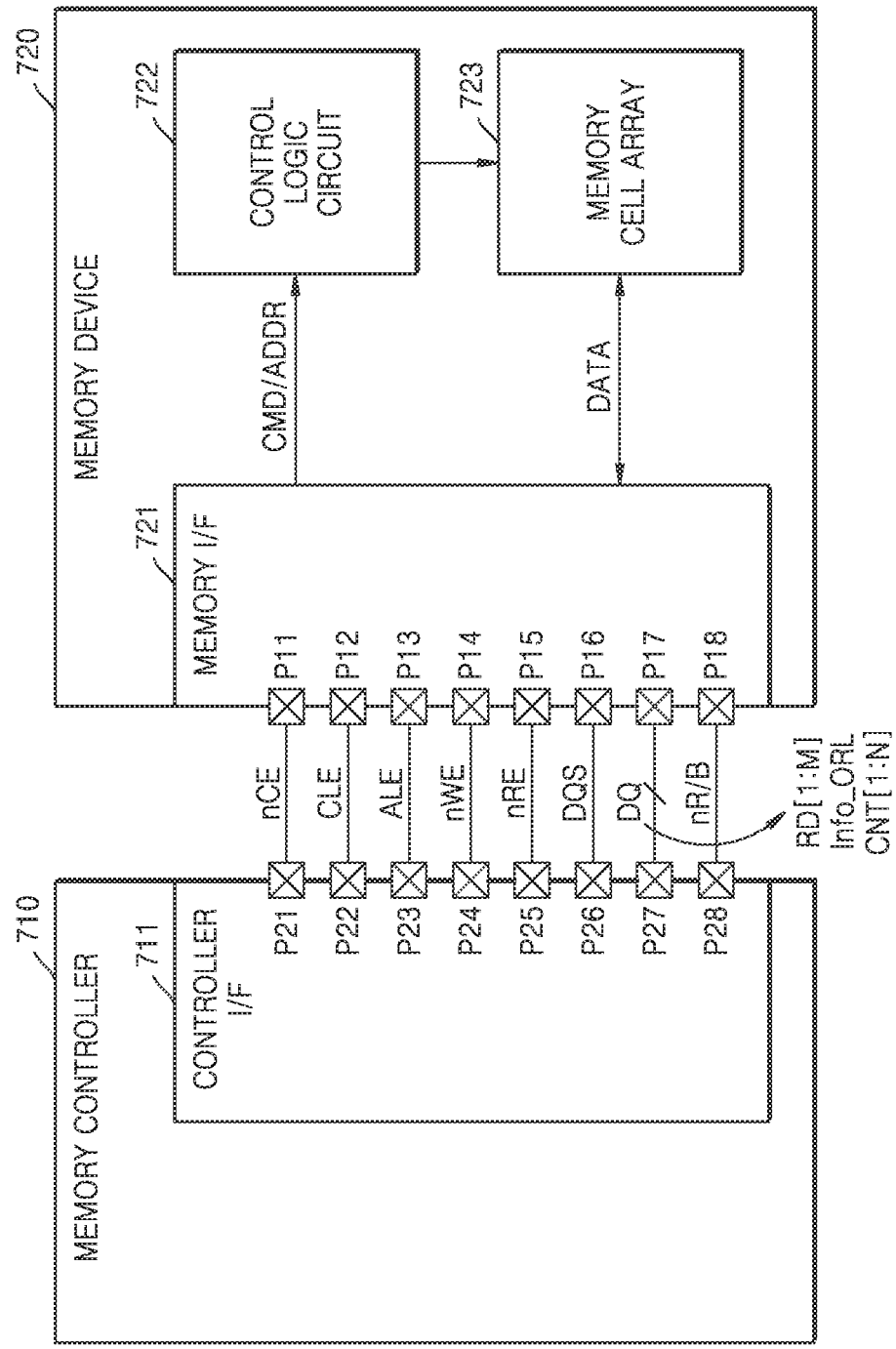
FIG. 16 is a block diagram illustrating a memory system according to an example embodiment.

FIG. 16 is a block diagram illustrating a memory system 700 according to an example embodiment.

Referring to FIG. 16, the memory system 700 may include a memory controller 710 and the memory device 720. The memory device 720 may correspond to one of non-volatile memory devices communicating with the memory controller 710 based on one of a plurality of channels. For example, the memory device 720 may correspond to the memory device 200 in FIG. 1, and the memory controller 710 may correspond to the memory controller 100 in FIG. 1.

The memory device 720 may include first through eighth pins P11 through P18, a memory interface (I/F) 721, and a memory cell array 723. The memory I/F 721 may receive a chip enable signal nCE from the memory controller 710 via a first pin P11. The memory I/F 721 may transceive signals to and from the memory controller 710 via second through eighth pins P12 through P18 according to the chip enable signal nCE. For example, when the chip enable signal nCE is in an enable state (for example, a low level), the memory I/F 721 may transceive signals to and from the memory controller 710 via the second through eighth pins P12 through P18.

The memory I/F 721 may receive a command latch enable signal CLE, an address latch enable signal ALE, and a write enable signal nWE from the memory controller 710 via the second through fourth pins P12 through P14. The memory I/F 721 may receive a data signal DQ from the memory controller 710 via the seventh pin P17, or may transmit the data signal DQ to the memory controller 710. The command CMD, the address ADDR, and the data DATA may be transmitted by using the data signal DQ.

The memory I/F 721 may obtain the command CMD from the data signal DQ, which is received during an enable period (for example, a high level state) of the command latch enable signal CLE, based on toggle timings of the write enable signal nWE. The memory I/F 721 may obtain the address ADD from the data signal DQ, which is received during an enable period (for example, a high level state) of the address latch enable signal ALE, based on toggle timings of the write enable signal nWE.

The memory I/F 721 may receive the chip enable signal nCE from the memory controller 710 via a fifth pin P15. The memory I/F 721 may receive a data strobe signal DQS from the memory controller 710 via the sixth pin P16, or may transmit the data strobe signal DQS to the memory controller 710.

The memory I/F 721 may transmit a ready/busy output signal nR/B to the memory controller 710 via the eighth pin P18. The memory I/F 721 may transmit state information about the memory device 720 to the memory controller 710 by using the ready/busy output signal nR/B. When the memory device 720 is in a busy state (that is, when internal operations of the memory device 720 are being performed), the memory I/F 721 may transmit the ready/busy output signal nR/B indicating a busy state to the memory controller 710. When the memory device 720 is in a ready state (that is, when internal operations of the memory device 720 are not performed or are completed), the memory I/F 721 may transmit the ready/busy output signal nR/B indicating a ready state to the memory controller 710.

A control logic circuit 722 may generally control various operations of the memory device 720. The control logic circuit 722 may receive the command/address CMD/ADDR obtained from the memory I/F 721. The control logic circuit 722 may generate control signals for controlling other components of the memory device 720 according to the received command/address CMD/ADDR. For example, the control logic circuit 722 may program the data DATA in the memory cell array 723, or may generate various control signals for reading the data DATA from the memory cell array 723.

The memory controller 710 may include first through eighth pins P21, P22, P23, P24, P25, P26, P27 and P28, and a controller interface circuit (I/F) 711. The first through eighth pins P21 through P28 of the memory controller 710 may correspond to the first through eighth pins P11, P12, P13, P14, P15, P16, P17 and P18 of the memory device 720, respectively.

According to example embodiments, the memory controller 710 may include a read level calculation module, and accordingly, may perform the optimal read level calculation operation according to above-described embodiments. As an example, the read data RD[1:M] read by using the plurality of read levels may be provided from the memory device 720 to the memory controller 710 via the seventh pins P17 and P27. In addition, the read level information Info_ORL generated by the memory controller 710 may be provided from the memory controller 710 to the memory device 720 via the seventh pins P17 and P27.

In addition, the counting operation according to the embodiments may be performed by the memory controller 710 or the memory device 720, and as an example, when the counting operation is performed by the memory device 720, the counting value CNT[1:N] may be provided from the memory device 720 to the memory controller 710 via the seventh pins P17 and P27.

While example embodiments been particularly shown and described, it will be understood that various changes in form and details may be made therein without departing from the spirit and scope of the following claims.

What is claimed is:

1. A memory controller configured to control a memory device, the memory controller comprising:
   a processor configured to control a memory operation on the memory device, wherein the processor is further configured to apply a plurality of read levels to a plurality of memory cells of the memory device to obtain a plurality of cell count values, and a first read level of the plurality of read levels causes first memory cells of the plurality of memory cells to turn on; and
   a read level calculation module configured to:
      receive N counting values corresponding to N read levels generated based on a counting operation on data read by using the plurality of read levels, wherein the N counting values correspond to the plurality of cell count values,
      model at least two cell count functions having selected read levels that are selected from the N read levels as inputs, and counting values corresponding to the selected read levels as outputs, wherein coefficients of the at least two cell count functions are based on the respective selected read levels, and
      calculate an optimal read level based on an optimal cell count function selected from the at least two cell count functions, wherein N is an integer equal to or greater than four,
   wherein the N counting values comprise counting values corresponding to at least four different read levels.

2. The memory controller of claim 1, wherein the read level calculation module is further configured to:
   calculate, for each of the at least two cell count functions, difference values between estimated counting values calculated with the N read levels as inputs and the N counting values, and
   select a cell count function having a least average error value of the at least two cell count functions as the optimal cell count function.

3. The memory controller of claim 1, wherein each of the at least two cell count functions corresponds to a second-degree function, and
   each cell count function is modeled based on three selected read levels of the N read levels, and three counting values corresponding to the three selected read levels, respectively.

4. The memory controller of claim 3, wherein a number of the at least two cell count functions corresponds to a number of all combinations of three read levels selected from the N read levels.

5. The memory controller of claim 1, wherein a first counting value of the N counting values corresponds to a difference value between a first number of on cells of data read by using the first read level and a second number of on cells of data read by using a second read level, and
   the second read level is less than the first read level.

6. The memory controller of claim 5, wherein the first read level corresponding to the first counting value is any one level of the first read level and the second read level, or any one arbitrary read level between the first read level and the second read level.

7. The memory controller of claim 1, further comprising an error correction code (ECC) circuit detecting an error of data read from the memory device,
wherein the read level calculation module is further configured to perform an operation of calculating the optimal read level when an uncorrectable error occurs in data read from the memory device.

8. A memory controller configured to control a memory device, the memory controller comprising:
a processor configured to control a memory operation on the memory device; and
a read level calculation module configured to:
receive N counting values corresponding to N read levels generated based on a counting operation on data read by using a plurality of read levels,
model at least two cell count functions having selected read levels that are selected from the N read levels as inputs, and counting values corresponding to the selected read levels as outputs, and
calculate an optimal read level based on an optimal cell count function selected from the at least two cell count functions, wherein N is an integer equal to or greater than four,
wherein the N counting values comprise counting values corresponding to at least four different read levels, and
wherein the read level calculation module comprises:
a modeling module configured to model the at least two cell count functions based on the N read levels and the N counting values corresponding thereto;
an error comparison module configured to select any one of the at least two cell count functions as the optimal cell count function, based on difference values between estimated counting values calculated by using the N read levels as inputs and the N counting values, for each of the at least two cell count functions; and
an operation module configured to calculate the optimal read level based on an operation on the optimal cell count function.

9. The memory controller of claim 1, further comprising an operation memory configured to store programs executed by the processor,
wherein the read level calculation module comprises programs for calculating the optimal read level, and the read level calculation module is loaded in the operation memory and executed by the processor.

10. The memory controller of claim 1, wherein the read level calculation module is further configured to a read level corresponding to an input, which makes an output of the optimal cell count function have a least value, as the optimal read level.

11. The memory controller of claim 1, further comprising a counting logic configured to receive data read by using the plurality of read levels from the memory device, and generate the N counting values based on the counting operation.

12. An operating method of a memory controller, the operating method comprising:
calculating a plurality of counting values corresponding to a plurality of read levels based on data read by using a plurality of read operations;
selecting, as an optimal cell count function, any one cell count function of a plurality of cell count functions, wherein each of the plurality of cell count functions are modeled by using some read levels selected among the plurality of read levels as inputs and corresponding counting values of the plurality of counting values as outputs; and
outputting information about an optimal read level calculated based on the optimal cell count function,
wherein function values having at least some of the plurality of read levels are calculated for each of the plurality of cell count functions, and the optimal cell count function is selected by comparing the function values with the plurality of counting values.

13. The operating method of claim 12, wherein each of the plurality of cell count functions corresponds to a second-degree function, and
wherein a number of cell count functions corresponds to a number of all combinations of three arbitrary read levels selected from the plurality of read levels.

14. The operating method of claim 12, wherein a first counting value of the plurality of counting values corresponds to a difference value between a first number of on cells of data read by using a first level and a second number of on cells of data read by using a second level, and
the second level is less than the first level.

15. The operating method of claim 14, wherein a first read level corresponding to the first counting value is any one level of the first level and the second level, or any one arbitrary level between the first level and the second level.

16. The operating method of claim 12, further comprising performing error detection on first data read from a memory device,
wherein, when there is an error in the first data, a calculation operation of the optimal read level is performed.

17. The operating method of claim 12, wherein a first cell count function, from among the plurality of cell count functions, is selected, in which a difference value between the function values and the counting values is least, as the optimal cell count function.

18. A memory system equipped with a memory device, wherein the memory device comprises:
a memory cell array comprising a plurality of memory cells;
a voltage generator configured to generate a plurality of read voltages having a plurality of read levels used in a read operation on the memory cell array; and
a control logic configured to:
control a re-read operation on the memory cell array by using the plurality of read levels when an error occurs in data read from the memory cell array, wherein the re-read operation applies the plurality of read voltages to a plurality of memory cells of the memory cell array to obtain a plurality of cell count values, and a first read level of the plurality of read levels causes first memory cells of the plurality of memory cells to turn on, and
generate N counting values corresponding to N read levels based on a counting operation on data read in the re-read operation, N being an integer equal to or greater than four, wherein the N counting values correspond to the plurality of cell count values,
wherein the N counting values comprise first information for modeling at least two cell count functions each having certain read levels of the N read levels as inputs, and a number of the certain read levels is less than N, wherein coefficients of the at least two cell count functions are based on the respective certain read levels.

19. The memory system of claim 18, further comprising a memory controller configured to control the memory device,
    wherein the memory controller is further configured to:
        receive the N counting values, and
        model the at least two cell count functions having the certain read levels selected from the N read levels as inputs and corresponding counting values of the N counting values as outputs,
        calculate an optimal read level based on an optimal cell count function selected among the at least two cell count functions, and
        provide second information about the optimal read level to the memory device.

20. The memory system of claim 19, wherein the control logic comprises:
    a voltage controller configured to provide a voltage control signal so that read voltages having the N read levels are generated in the re-read operation; and
    a counting logic configured to generate the N counting values based on the counting operation on data read in the re-read operation.

\* \* \* \* \*